United States Patent
Yamamichi et al.

(10) Patent No.: US 6,225,133 B1
(45) Date of Patent: May 1, 2001

(54) METHOD OF MANUFACTURING THIN FILM CAPACITOR

(75) Inventors: Shintaro Yamamichi; Hirohito Watanabe; Yoichi Miyasaka, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/299,407

(22) Filed: Sep. 1, 1994

(30) Foreign Application Priority Data

Sep. 1, 1993 (JP) ................................................. 5-217127

(51) Int. Cl.$^7$ ............................. H01L 21/00; B05D 5/12
(52) U.S. Cl. .................................. 438/3; 427/79; 427/80; 29/25.03; 29/25.41; 438/239; 438/253; 438/396; 438/692; 438/693
(58) Field of Search ..................................... 427/79, 80, 56, 427/97; 437/52; 438/3, 239, 692, 253, 396, 69.3; 29/25.03, 25.41

(56) References Cited

U.S. PATENT DOCUMENTS

| | | | |
|---|---|---|---|
| 5,185,689 | * | 2/1993 | Maniar .................................. 361/313 |
| 5,332,684 | * | 7/1994 | Yamamichi et al. .................. 437/52 |
| 5,366,920 | * | 11/1994 | Yamamichi et al. .................. 437/52 |
| 5,406,447 | * | 4/1995 | Miyazaki .............................. 301/313 |

OTHER PUBLICATIONS

T. Ema et al., "3–Dimensional Stacked Capacitor Cell for 16M and 64M DRAMs", International Electron Devices Meeting Digest of Technical Papers, 1988, pp. 592–595.

K. Koyama et al., "A Stacked Capacitor with ($Ba_xSr_{1-x}TIO_3$ For 256M DRAM", International Electron Devices Meeting Digest of Technical Papers, 1991, pp. 823–826.

* cited by examiner

*Primary Examiner*—Brian K. Talbot
(74) *Attorney, Agent, or Firm*—Sughrue, Mion, Zinn, Macpeak & Seas, PLLC

(57) ABSTRACT

After an interlayer insulating film is deposited on a silicon substrate, a contact hole or contact holes is or are formed at a desired position(s) and, then, after a polysilicon layer is deposited and the contact hole(s) is (are) embedded, the surface of the polysilicon layer is flattened by chemical and mechanical polishing using at least one of piperazine or colloidal silica slurry, and a barrier metal film 4 and a highly dielectric thin film 5 are deposited and processed to a desired size. Finally, an Al/TiN film 6 adapted for the upper electrode is formed. The leak current of the thin film capacitor which is obtained according to this method can be greatly reduced.

8 Claims, 7 Drawing Sheets

METHOD OF MANUFACTURING THIN FILM CAPACITOR

BACKGROUND OF THE INVENTION

The present invention relates to a thin film capacitor adapted for integrated circuits and a method of manufacturing the same.

Conventionally, in a thin film capacitor adapted for semiconductor integrated circuit, a lamination structure using a polysilicon film for the upper and lower electrodes and a silicon oxide film and a silicon nitride film for the dielectric film has been used. In the dynamic random access memory (DRAM), a technique in which a capacitor portion is formed after the transistor and the bit line are formed is described (see, for example, "International Electron Devices Meeting Digest of Technical Papers", 1988, page 592 through 595).

In the foregoing conventional thin film capacitor, it has been recognized that there is a limit posed to the reduction of the area of the capacitor portion so as to correspond to the recent high degree of the integrated circuit. Therefore, it is necessary to effectively reduce the area of the capacitor portion by thinning the dielectric film of the thin film capacitor, making it highly dielectric and stereoscopic. Since the dielectric film forming the conventional capacitor comprises a film of silicon oxide or silicon nitride having the dielectric constant on the order of at most 7, in order to achieve the required capacitive value, and an extremely thin film thickness of below 5 nm which is called for in terms of that of the silicon oxide film.

On the other hand, for such a thin film thickness, it is very difficult to realize a dielectric thin film having a current/voltage characteristic which is below the allowable leak current, and even if a method of increasing the area of the electrode effectively by using the three-dimensional structure is used, then the dielectric film becomes thin at the lower electrode, where the electric field is concentrated causing increase of the leak current.

Therefore, it is conceivable to realize the required capacitor with a greater film thickness than that of the silicon oxide film or the like by using a highly dielectric thin film typically represented by $SrTiO_3$ having a dielectric constant close to, for example, 300 at the room temperature, or $(Ba, Sr)TiO_3$, $Pb(Zr, Ti)O_3$, $Pb(Mg, Nb)O_3$ and $Pb(Mg, W)O_3$ having a further greater dielectric constant for barrier metal to suppress the diffusion of silicon and by using Pt/Ta, Pt/Ti and $RuO_2$, which form no low dielectric layer even within the oxidizing atmosphere in which the highly dielectric film is deposited.

However, even in this case, if large corrugated portions are present on the primer base on which the highly dielectric thin film is deposited, since the leak current is increased, an excellent capacitor cannot be realized. In particular, if the capacitor is formed after a contact hole is provided through the interlayer insulating film and the like, the flattenability of the surface of the polysilicon layer after the contain hole is embedded becomes a problem.

Usually, the polysilicon layer is deposited according to the CVD process in such a thickness that the contact hole can fully be embedded, is reduced in resistance by diffusing an impurity into this layer, and then is etched back according to the dry etching process using $Cl_2$ to remove its unnecessary portions. However, in the etch-backing according to such dry etching, if the surface of the interlayer insulating film merges due to the microloading effect, then the etching speed rises rapidly, and up to the polysilicon layer within the contact hole is overetched. The overetched amount at this time, if a 6-inch wafer is used, amounts to 200 through 300 nm within the wafer surface, and the surface of the polysilicon layer also forms several ten nms of convex and concave portions.

When the barrier metal layer, highly dielectric thin film and the electrically conductive film adapted for the upper electrode are deposited on the primer base having such steps, it is difficult to obtain the leak current characteristic with excellent repeatability as they are deposited on a flat substrate due to the presence of the steps around the contact hole and of the convex and concave portions of the surface of the polysilicon layer.

Furthermore, in the thin film capacitor array using the highly dielectric film, even when the etch back of a second interlayer insulating film is applied to separate between each capacitor, according to the dry etching by $CF_4$ gas or the like, it is difficult to remove the interlayer insulating film evenly within the wafer surface.

SUMMARY OF THE INVENTION

According to the present invention, there is provided a method of manufacturing a thin film capacitor comprising the steps of:

depositing an interlayer insulating film on a semiconductor substrate;

forming one or more contact holes at a desired position of said interlayer insulating film;

depositing a polysilicon layer to embed said contact hole(s);

flattening the surface of said polysilicon layer by chemical and mechanical polishing using at least one of piperazine and colloidal silica slurry; and depositing on the flattened polysilicon layer a barrier metal film, a highly dielectric thin film and an electrically conductive film for the upper electrode and then processing those films to have a predetermined size.

In order to solve the problems of overetching and of the occurrence of the convex and concave portions of the surface as occur when the foregoing polysilicon layer is etched back, in the method according to the present invention, the flattenability of the surface is achieved by using not the dry etching process, but a chemical and mechanical polishing process using piperazine or colloidal silica slurry, to etch back the polysilicon layer to suppress the increase of the leak current.

Furthermore, in order to solve the problem of overetching as occurs when the second interlayer insulating film is etched back, in the present invention, the surface is flattened by using the chemical and mechanical polishing process utilizing the colloidal silica slurry to thereby suppress the increase of leak current to improve the evenness within the surface and the repeatability.

DESCRIPTION OF THE PREFERRED EMBODIMENTS

Figure 1A:
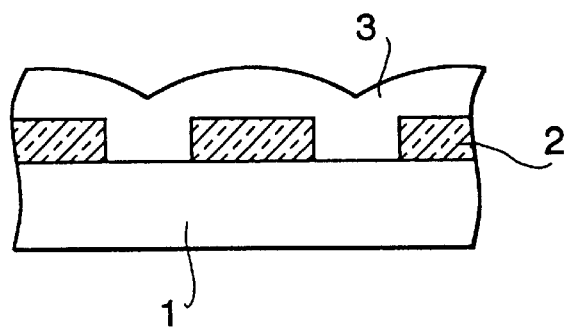
FIG. 1 is across-sectional view of a semiconductor chip for explaining a first variant of the method of the present invention.
Figure 1B:
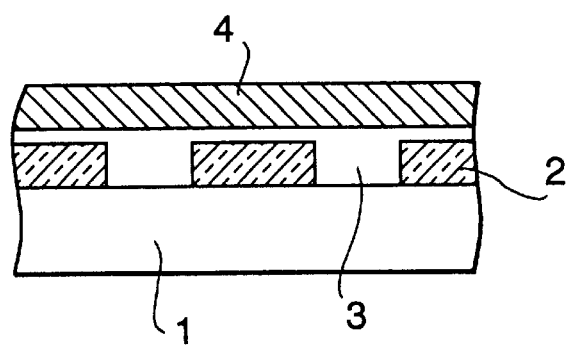
Figure 1C:
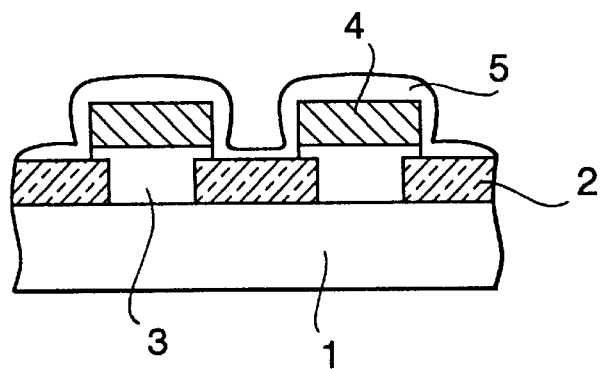
Figure 1D:
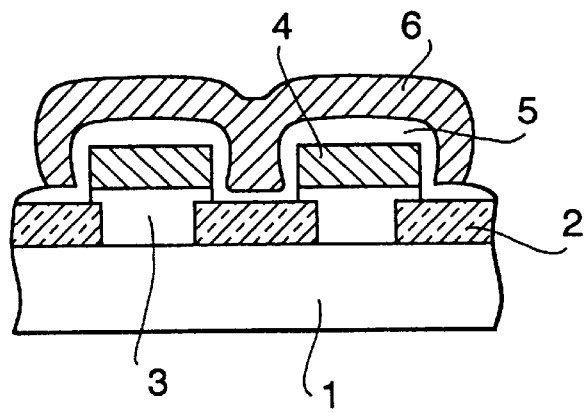

The present invention will now be described with reference to the accompanying drawings. FIG. 1(*a*) through FIG. 1(*d*) are respectively a cross-sectional view for explaining a semiconductor chip manufactured according to the present invention.

In the embodiment illustrated in FIG. 1(*a*), an interlayer insulating film 2 comprising $SiO_2$ was formed on an n-type silicon substrate having a resistivity of 0. 01 Ω·cm to a thickness of 600 nm by thermal oxidation, then a contact holes were formed at a desired positions, then, a polysilicon layer 3 was deposited to have a thickness of 1 μm according to the CVD process, and the polysilicon layer 3 was reduced in resistivity by diffusion of phosphorous.

Next, in the embodiment illustrated in FIG. 1(*b*), a polishing solution containing 1 g/l of piperazine was used, and the chemical and mechanical polishing of the surface of the polysilicon layer 3 was conducted for one minute under the polishing pressure of 50 kgf. By this treatment, the convex and concave portions caused by formation of the contact holes immediately after the film of the polysilicon layer 3 was formed disappeared and a thickness of 50 nm of the polysilicon layer 3 was left uniformly on the interlayer insulating film 2 and the contact hole. Further, on this polysilicon layer 3, $RuO_2$ (thickness 500 nm)/Ru (thickness 50 nm) film was formed as the barrier metal 4 according to the DC sputtering process.

In the example illustrated in FIG. 1(*c*), the barrier metal film 4 and the polysilicon layer 3 were processed to a desired size according to the ECR plasma etching process using a mixture of $Cl_2$ and $O_2$ gases, and a highly dielectric thin film $(Ba_{0.5}, Sr_{0.5})TiO_3$ (thickness 100 nm) film 5 was formed thereon at the substrate temperature of 650° C. and under the beam voltage of 100V and the beam current of 40 mA according to the ion beam sputtering process.

In the example illustrated in FIG. 1(*d*), an Al (thickness 1 mm)/TiN (thickness 50 nm) film 6 is formed as the electrically conductive film adapted for the upper electrode according to the DC magnetron sputtering process, and was processed to a desired size according to the etching process using $Cl_2$ gas to form the upper electrode to thereby complete a thin film capacitor.

Figure 2:
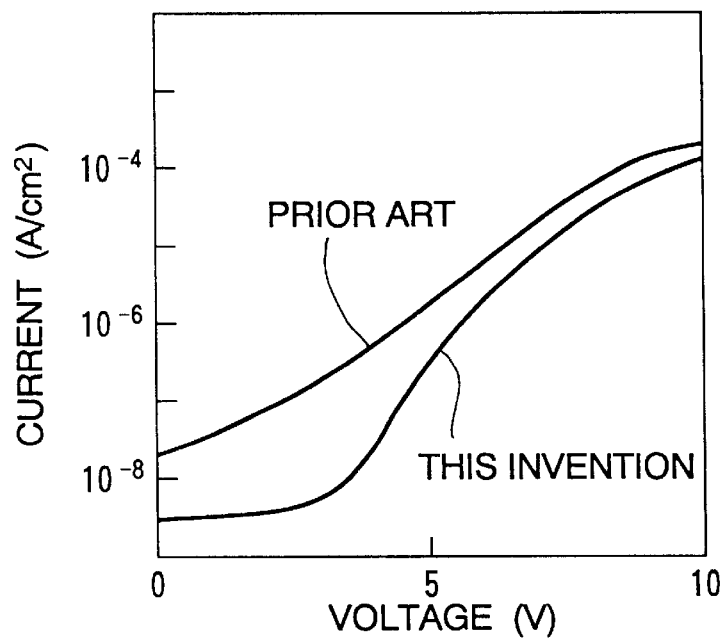
FIG. 2 is a view illustrating the difference between the current/voltage characteristics of a thin film capacitor according to the present invention and a conventional thin film capacitor.

FIG. 2 is a view for comparing the current/voltage characteristics of the capacitor manufactured according to the first variant of the present invention and a conventional capacitor. The conventional capacitor is great in leak current at the low electric field. This is due to the presence of the concave and concave surface as occurs when the polysilicon layer is etched back. On the other hand, in the thin film capacitor obtained according to the process of the present invention, it was found that the leak current is also small and that it exhibits a more excellent insularity than in the conventional capacitor.

Although, in the first variant of the present invention, a capacitor in which only the barrier metal film was processed to a desired size was shown, the barrier metal film and the highly dielectric thin film may be processed to the same size so that their lateral surface is covered with a second interlayer insulating film. Further, parts of the barrier metal, dielectric thin film and electrically thin film adapted for the upper electrode may be processed to the same size to cover their lateral surface with the second interlayer insulating film. Further, although, in the first variant, polysilicon was used as the electrically conductive film for embedding the contact hole, tungsten or its alloy may be used.

Figure 3A:
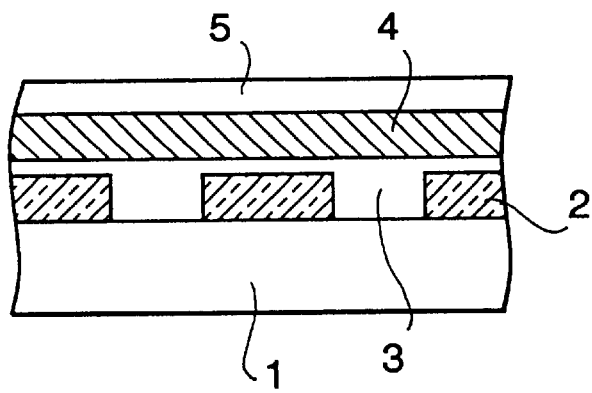
FIG. 3 is a cross-sectional view of a semiconductor chip for explaining a second variant of the present invention.
Figure 3B:
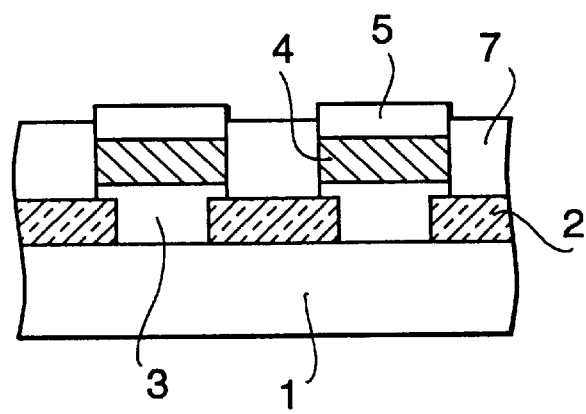
Figure 3C:
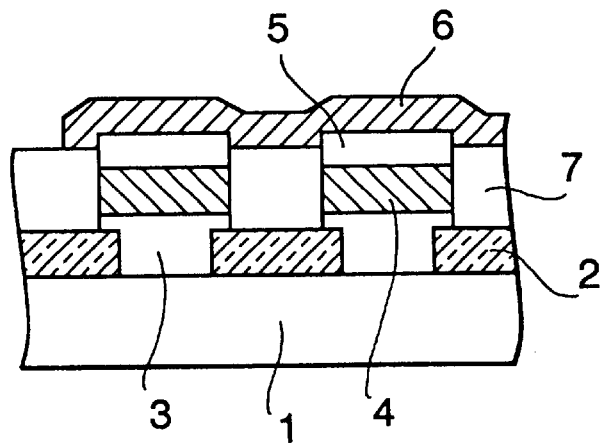

FIG. 3(*a*) through FIG. 3(*c*) are respectively a cross-sectional view for explaining a semiconductor chip manufactured according to a second variant of the present invention.

In FIG. 3(*a*), an interlayer insulating film 2 made of $SiO_2$ and a polysilicon layer 3 are formed on the n-type silicon substrate 1 and, then, the surface of the polysilicon layer 3 is flattened by repeating the same procedures same as in the first variant. Subsequently, a barrier metal film 4 made of $RuO_2/Ru$ is formed on the polysilicon layer 3 according to the DC magnetron sputtering process. Then, a $(Ba_{0.5}, Sr_{0.5})TiO_3$ film 5 (thickness 100 nm) was formed as the highly dielectric thin film under the conditions of substrate temperature of 650° C., beam voltage of 1000V and beam current of 40 mA.

In the example illustrated in FIG. 3(*c*), an Al/TiN film 6 was formed according to the DC magnetron sputtering process, and was processed to a desired size using $Cl_2$ gas to form an upper electrode.

Also, with the thin film capacitor obtained according to the second variant of the present invention, its current/voltage characteristic exhibited a trend similar to that shown in FIG. 2, which was improved greater than when the conventional technique was used.

Furthermore, in the second variant of the present invention, since the $(Ba_{0.5}, Sr_{0.5})TiO_3$ film 5 is left only on the upper surface of the barrier metal film 4 and its lateral surface is covered with a thick Spin On Glass (SOG) (film, the initial degradation of the current/voltage characteristic is further reduced as compared with that of the first variant. Further, the coupling capacity value when a plurality of capacitors exists is reduced.

Figure 4A:
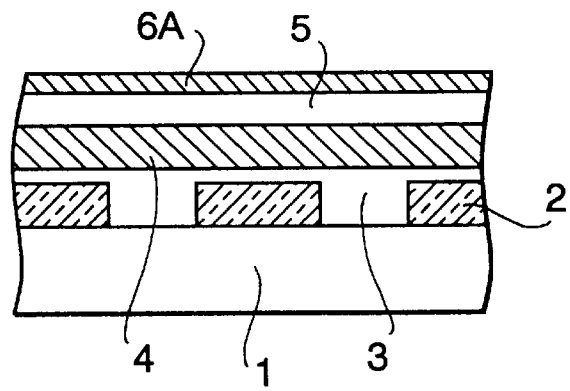
FIG. 4 is a cross-sectional view of a semiconductor chip for explaining a third variant of the present invention.
Figure 4B:
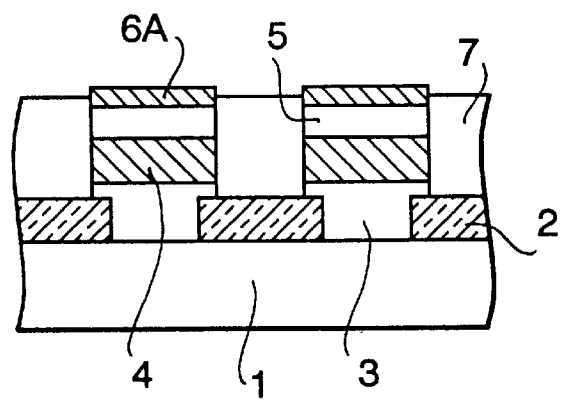
Figure 4C:
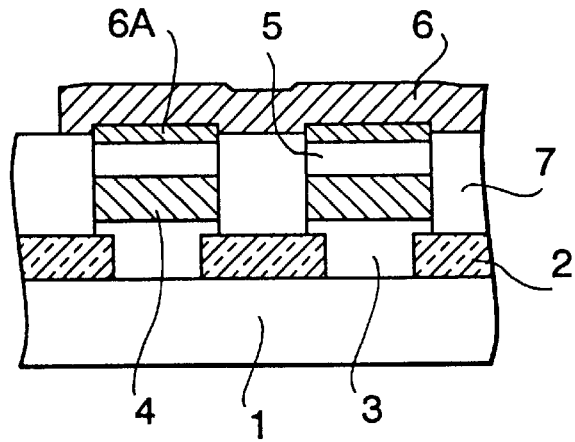

FIG. 4(*a*) through FIG. 4(*c*) are respectively a cross-sectional view for explaining a semiconductor chip manufactured according to a third variant of the present invention.

First, in the example illustrated in FIG. 4(*a*), as in the second variant, an interlayer insulating film 2 and a polysilicon layer 3 were formed on an n-type silicon substrate 1, a barrier metal film 4 was formed thereon according to the DC magnetron sputtering process, and then, a highly dielectric $(Ba_{0.5}, Sr_{0.5}) TiO_3$ film 5 was formed according to the ion beam sputtering process. Next, a TiN film (thickness 50 nm) 6A was formed as part of the electrically conductive film adapted for the upper electrode according to the DC magnetron sputtering process.

In the example illustrated in FIG. 4(*b*), a TiN film 6A, $(Ba_{0.5}, Sr_{0.5})TiO_3$ film 5, barrier metal film 4 and polysilicon layer 3 were processed to the same size according to the ECR plasma etching process using a mixture of $Cl_2$ and $O_2$ and, after they were flattened by applying an SOG film 7, they were etched back according to the ECR plasma etching process using a $CHF_3$ gas to expose the surface of the TiN film 6A.

In the example illustrated in FIG. 4(*c*), an Al/TiN 6 film was formed according to the DC magnetron sputtering process to process to a desired size using a $Cl_2$ gas to form an upper electrode also serving as the connection of the capacitor.

Also, the capacitor obtained according to the third variant exhibits a current/voltage characteristic similar to that of FIG. 2, which was greatly improved as compared with one using the conventional process. Furthermore, in the third variant, since up to the TiN film 6A constituting the upper electrode is etched, no portion of the SOG film which remains to be etched, which occurs once in a while, occurs on $(Ba_{0.5}, Sr_{0.5})TiO_3$ film. Consequently, no capacitive value is reduced to one smaller than the designed value.

Figure 5A:
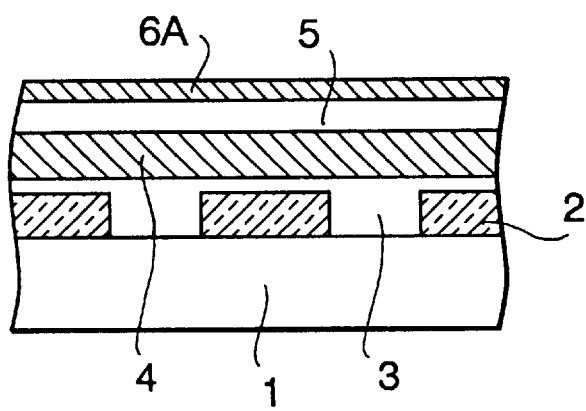
FIG. 5 is a cross-sectional view of a semiconductor chip for explaining a fourth variant of the present invention.
Figure 5B:
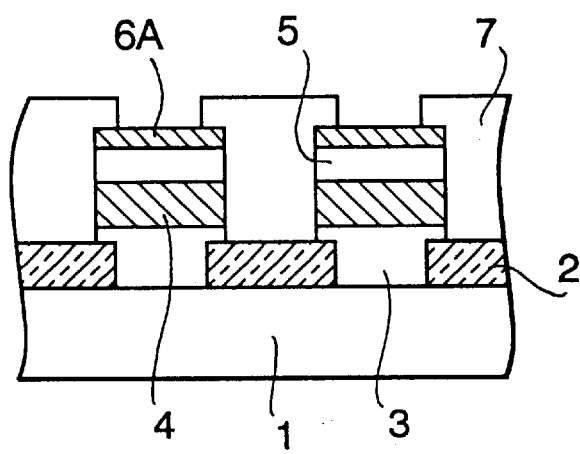
Figure 5C:
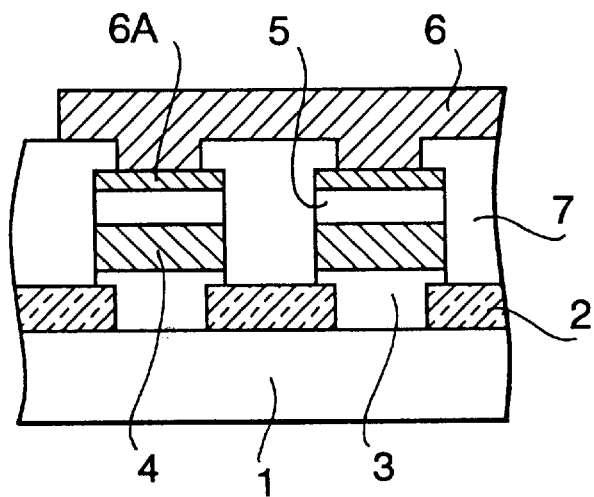

FIG. 5(a) through FIG. 5(c) are respectively a cross-sectional view for explaining a semiconductor chip manufactured according to a fourth variant of the present invention.

In the example illustrated in FIG. 5(a), as in the third variant, an interlayer insulating film 2 and a polysilicon layer 3 were formed on an n-type silicon substrate, on which a barrier metal film 4 was formed according to the DC magnetron sputtering process and, then, a highly dielectric $(Ba_{0.5}, Sr_{0.5})TiO_3$ film 5 was formed according to the ion beam sputtering process and further, a TiN film 6A, which is part of the upper electrode film, was formed.

Next, in the example illustrated in FIG. 5(b), a TiN film 6A, a $(Ba_{0.5}, Sr_{0.5})TiO_3$ film 5, a barrier metal film 4 and a polysilicon layer 3 were processed to the same size according to the ECR plasma etching process using a mixture of $Cl_2$ and $O_2$ and, after the SOB film 7 was applied for flattening thereof, a contact hole was formed again to expose a Ti film 6A.

In the example illustrated in FIG. 5(c), an Al/TiN film 6 was formed according to the DC magnetron sputtering process and was processed to a desired size using $Cl_2$ gas to form an upper electrode also serving as the connection to the capacitor.

The resulting current/voltage characteristic of the thin capacitor exhibited a tendency similar to that of FIG. 2, which was greatly improved than those of the capacitors which were made according to the conventional techniques.

In this fourth variant, since no etching back was conducted to the SOG film 7 as different from the first variant, the dispersion of the film thickness within the surface of the SOG film 7 did not exert effect on the current/voltage characteristic. That is, the margin during the process was increased, and the repeatability was improved.

Figure 6A:
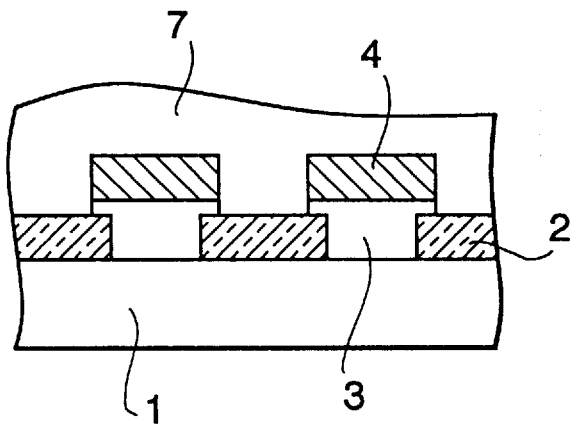
FIG. 6 is a cross-sectional view of a semiconductor chip for explaining a fifth variant of the present invention.

Furthermore, as illustrated in FIG. 6(a), as in the first variant, an interlayer insulating film 2 and a polysilicon layer 3 were formed on the n-type silicon substrate 1, on which a barrier metal film ($RuO_2/Ru$) film 4 was formed according to the DC magnetron sputtering process and, then, the barrier metal film 4 and the polysilicon layer 3 were processed to a desired size according to the ECR plasma etching process using a mixture of $Cl_2$ and $O_2$. Subsequently, an SOG film 7 was applied for flattening.

Figure 6B:
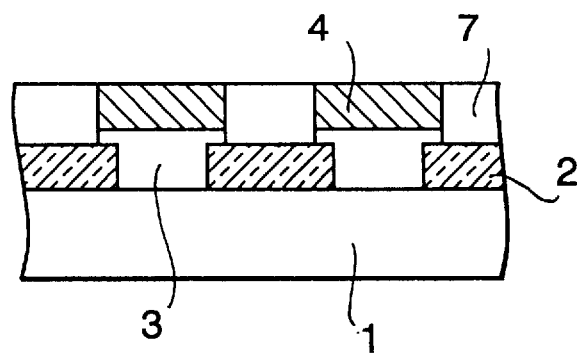

Next, as illustrated in FIG. 6(b), a colloidal silica slurry was used to chemically polish under the polishing pressure of 50 kgf until the surface of the barrier metal film 4 was exposed to flatten the surface of the SOG film 7. At this time, even if the surface of the $RuO_2/Ru$ film is partly polished, there is no problem as long as it does not lose the electrical conductivity as the barrier metal.

Figure 6C:
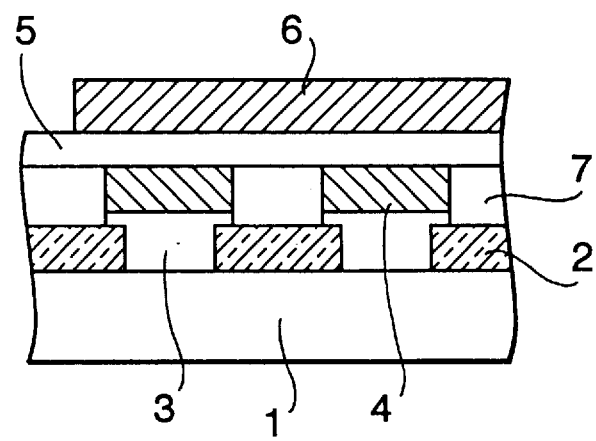

In the example illustrated in FIG. 6(c), the $(Ba_{0.5}, Sr_{0.5})TiO_3$ film 5 was formed under the conditions of substrate temperature 650 degrees Centigrade, beam voltage 1000V and beam current 40 mA according to the ion beam sputtering process, then the Al/TiN film 6 was formed according to the DC magnetron sputtering process and was processed to a desired size using $Cl_2$ gas to form the upper electrode.

The resulting current/voltage characteristic of this capacitor exhibited a tendency similar to that of FIG. 2, which was greatly improved as different from the conventional techniques. Further, since chemical polishing was used in place of dry etching used in the first variant to flatten the SOG film 7, the evenness and the repeatability within the wafer surface were improved.

Figure 7A:
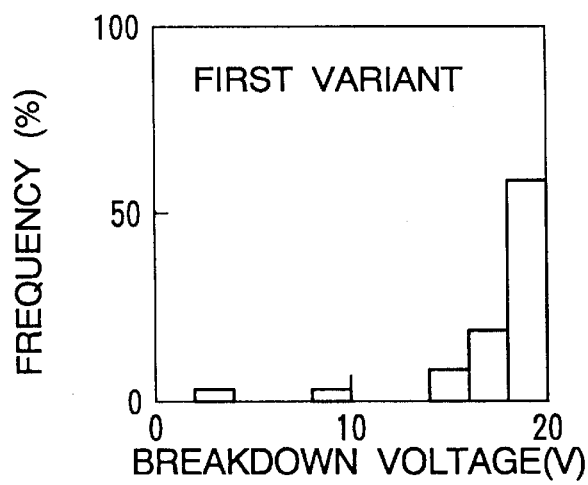
FIG. 7 is a view for comparing the breakdown distribution of the thin film capacitors according to the first and fifth variants.
Figure 7B:
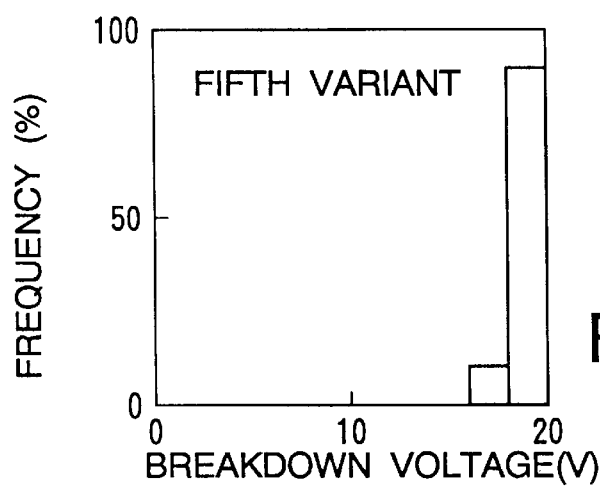

The results obtained by comparing the dielectric distributions of the thin film capacitors of the first and fifth variants are shown in FIGS. 7(a) and 7(b), respectively. As shown in FIGS. 7(a) and 7(b), in the fifth variant, since the repeatability in the etching process of the SOG film 7 was improved, the dispersing level of dielectric distribution was reduced.

Figure 8A:
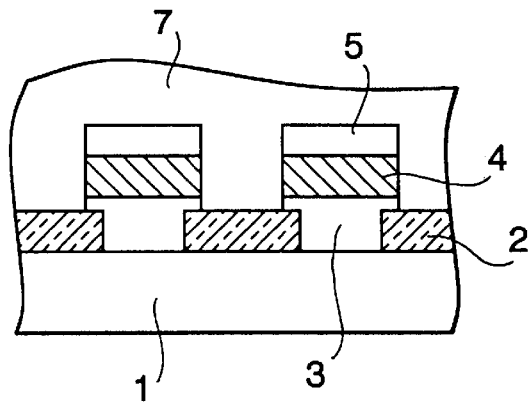
FIG. 8 is a cross-sectional view of a semiconductor chip for explaining a sixth variant of the present invention.
Figure 8B:
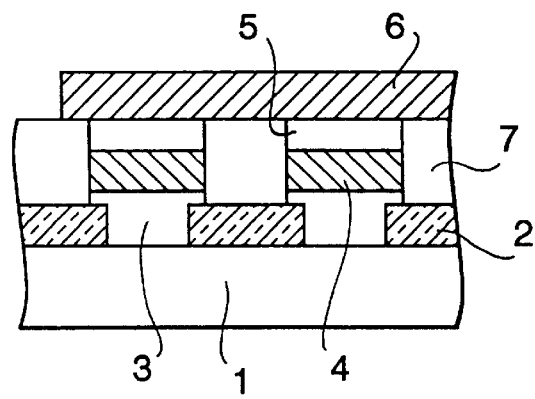

FIGS. 8(a) and 8(b) are respectively a cross-sectional view for explaining a semiconductor chip manufactured according to a sixth variant of the present invention.

First, in the example illustrated in FIG. 8(a), as in the second variant, an interlayer insulating film 2 comprising $SiO_2$ and a polysilicon layer 3 were formed on an n-type silicon substrate 1. Next, a barrier metal film 4 was formed thereon according to the DC magnetron sputtering process and, subsequently, a $(Ba_{0.5}, Sr_{0.5})TiO_3$ film 5 was formed according to the ion beam sputtering process. Thereafter, after the $(Ba_{0.5}, Sr_{0.5})TiO_3$ film 5, barrier metal film 4 and polysilicon layer 3 were processed to a desired size according to the ECR plasma etching process using a mixture of $Cl_2$ and $O_2$, an SOG film 7 was applied for flattening.

In the example illustrated in FIG. 8(b), chemical polishing was carried out under the polishing pressure of 50 kgf by using colloidal silica slurry until the surface of the $(Ba_{0.5}, Sr_{0.5})TiO_3$ was exposed. Finally, an Al/TiN film 6 was formed according to the DC magnetron sputtering process, and was processed to a desired size using $Cl_2$ gas to form the upper electrode.

The current/voltage characteristic of the resulting capacitor also exhibited a tendency similar to that of FIG. 2, which was greatly improved as compared with the case in which the conventional technique was used. Further, since dry etching was not utilized unlike the second variant to flatten the SOG film 7, as described with reference to the fifth variant, the evenness and repeatability within the wafer surface was improved and the dispersion of the dielectric distribution was reduced.

Figure 9A:
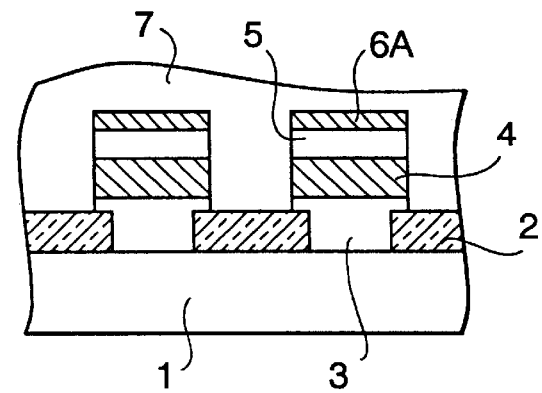
FIG. 9 is a cross-sectional view of a semiconductor chip for explaining a seventh variant of the present invention.
Figure 9B:
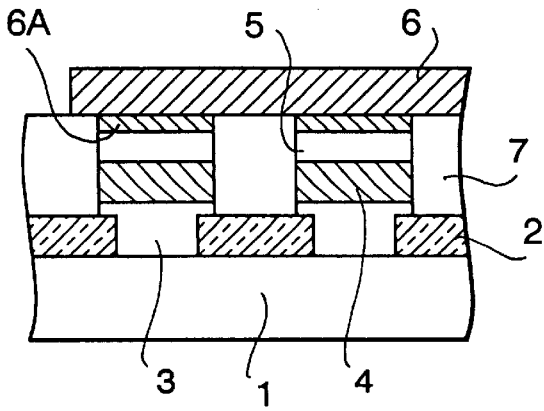

FIGS. 9(a) and 9(b) respectively show cross-sectional views for explaining a semiconductor chip manufactured according to a seventh variant of the present invention.

First, in the example illustrated in FIG. 9(a), as in the third variant, an interlayer insulating film 2 and a polysilicon layer 3 were formed on an n-type silicon substrate 1, on which a barrier metal film 4 was formed according to the DC magnetron sputtering process and, subsequently, a $(Ba_{0.5}, Sr_{0.5})TiO_3$ film 5 was formed according to the ion beam sputtering process. Further, a TiN film 6A, which is part of the upper electrode film, was formed according to the DC magnetron sputtering process. A TiN film 6A, $(Ba_{0.5}, Sr_{0.5})TiO_3$ film 5, barrier metal film 4 and polysilicon layer 3 were processed to a desired size according to the DC plasma sputtering process using a mixture of $Cl_2$ and $O_2$ and was applied with an SOG film 7 for flattening.

In the example illustrated in FIG. 9(b), chemical and mechanical polishing was carried out under the polishing pressure of 50 kgf by using colloidal silica slurry until the surface of TiN film 6A was exposed to flatten the surface of the SO film 7. At this time, even if part of the TiN film 6A is polished, there will be no problem as long as it does not lose the electrical conductivity as the upper electrode. Finally, an Al(1)/TiN film 6 was formed according to the DC magnetron sputtering process, and was processed to a desired size using $Cl_2$ gas to form an upper electrode also serving as the connection to the capacitor.

The current/voltage characteristic of this resulting capacitor also exhibited a tendency similar to that of FIG. 2, which was greatly improved as compared with the case in which the conventional technique was used. Further, since, unlike the third variant, no dry etching was used to flatten the SOG film 7, as described in the fifth variant, the evenness and repeatability within the wafer surface was improved and the dispersing level of the dielectric distribution was reduced.

Although, in the forgoing description was made as to the case in which the $(Ba_{0.5}, Sr_{0.5}) TiO_3$ was used as the dielectric film, the present invention is no restricted to this, and it is also possible to use a substance as such which is represented according to the following general formula:

$$ABO_3$$

where, A represents one or more of Ba, Sr, Pb, La, Li and K, and B represents one or more of Zr, Ti, Ta, Nb, Mg, Mn, Fe, Zn and W. By way of examples of such substances, $SrTiO_3$, $PbTIO_3$, $Pb(Zr, Ti)O_3$, $(Pb, La)(Zr, Ti)O_3$, $Pb(Mg, Nb)O_3$, $Pb(Mg, W)O_3$, $Pb(Zn, Nb)O_3$, $LiTaO_3$, $LiNbO_3$, $KTaO_3$ and $KNbO_3$ may be enumerated.

Otherwise, $Ta_2O_5$, $Bi_4Ti_3O_{12}$, $BaMgF_4$ or the like may be advisably used.

Furthermore, although $RuO_2/Ru$ was used as the barrier metal film, an arrangement in which Pt is provided as the lower electrode and a barrier layer is provided therebelow such as Ta or TiN may be effectively used.

Although, in the illustrated example, a plurality of capacitors was used, the present invention is also effective to form a single capacitor.

As described above, the thin film capacitor using the highly dielectric film according to the present invention can suppress the increase of the leak current and further improve the repeatability and mass producibility because the polysilicon layer in within which the contact hole is embedded or the interlayer insulating film within which each capacitor is embedded is flattened according to the chemical and mechanical polishing process using piperazine or colloidal silica slurry.

What is claimed is:

1. A method of manufacturing a thin film capacitor comprising the steps of:
    depositing an interlayer insulating film on a semiconductor substrate;
    forming one or more contact holes at a desired position of said interlayer insulating film;
    depositing a polysilicon layer to embed said contact hole(s);
    flattening a surface of said polysilicon layer by chemical and mechanical polishing using at least one of piperazine and colloidal silica slurry; and
    depositing on the flattened polysilicon layer a barrier metal film, a dielectric thin film having a high dielectric constant and an electrically conductive film for an upper electrode and then processing those films to have a desired size.

2. The method according to claim 1 wherein said dielectric thin film is made of one of the substances represented by the following formula:

$$ABO_3$$

where A is selected from at least one of the group consisting of Ba, Sr, Pb, La, Li and K, and where B is selected from at least one of the group consisting of Zr, Ti, Ta, Nb, Mg, Mn, Fe, Zn and W.

3. The method according to claim 1 wherein said dielectric film comprises a substance selected from the group consisting of $SrTiO_3$, $PbTiO_3$, $Pb(Zr, Ti)O_3$, $(Pb, La)(Zr, Ti)O_3$, $Pb(Mg, Nb)O_3$, $Pb(Mg, W)O_3$, $Pb(Zn, Nb)O_3$, $LiTaO_3$, $LiNbO_3$, $KTaO_3$ and $KNbO_3$.

4. The method according to claim 1 wherein said dielectric film comprises a substance selected from the group consisting of $Ta_2O_5$, $Bi_4Ti_3O_{12}$ and $BaMgF_4$.

5. The method according to claim 1 wherein said barrier metal film comprises $RuO_2/Ru$.

6. A method of manufacturing a thin film capacitor comprising the steps of:
    depositing a first interlayer insulating film on a semiconductor substrate;
    forming one or more contact holes at a desired positions (s) of said first interlayer insulating film;
    depositing a polysilicon layer to embed said contact hole(s);
    depositing a barrier metal film on the entire surfaces of said interlayer insulating film and said polysilicon layer;
    processing said barrier metal film to have a desired size, followed by depositing a second interlayer film on the entire surface of said barrier metal layer;
    flattening the surface of said second interlayer insulating film by chemical and mechanical polishing using colloidal silica slurry to expose the surface of said barrier metal film, and
    depositing a dielectric thin film having a high dielectric constant and an electrically conductive film for an upper electrode on the entire surface and then processing those films to have a desired size.

7. A method of manufacturing a thin film capacitor comprising the steps of;
    depositing a first interlayer insulating film on a semiconductor substrate;
    forming at least one contact hole at a desired position of said first interlayer insulating film;
    depositing a polysilicon layer to embed said contact hole;
    depositing a barrier metal film and a dielectric thin film having a high dielectric constant and processing the resultant film to have a desired size, followed by depositing a second interlayer insulating film on the entire surface of said dielectric thin film and said first interlaver insulating film; and
    flattening the surface of said second interlayer insulating film by chemical and mechanical polishing using colloidal silica slurry to process to a desired size.

8. A method of manufacturing a thin film semiconductor comprising the steps of:

depositing a first interlayer insulating film on a semiconductor substrate;

forming at least one contact hole at a desired position of said first interlayer insulating film;

depositing a polysilicon layer to embed said contact hole;

depositing a barrier metal, a dielectric thin film having a high dielectric constant and an electrically conductive film for an upper electrode and then processing those films to have a desired size, followed by depositing a second interlayer insulating film on the entire surface of said electrically conductive film and said first interlayer insulating film; and flattening the surface of said second interlayer insulating film by chemical and mechanical polishing using colloidal silica slurry to expose the surface of said electrically conductive film.

* * * * *